US005515009A

United States Patent [19]

Wong et al.

[11] Patent Number: 5,515,009

[45] Date of Patent: May 7, 1996

[54] SPACE-FED HORN FOR QUASI-OPTICAL SPATIAL POWER COMBINERS

[75] Inventors: Sam H. Wong, Yorba Linda; Douglas K. Waineo, Placentia; James A. Benet, Yorba Linda; Chris I. Igwe, Cerritos, all of Calif.

[73] Assignee: Rockwell International Corporation, Seal Beach, Calif.

[21] Appl. No.: 304,993

[22] Filed: Sep. 13, 1994

[51] Int. Cl.$^6$ .......... H03F 3/60

[52] U.S. Cl. .......... 330/286; 330/295; 343/786

[58] Field of Search .......... 330/124 R, 286, 330/295, 53, 54, 56; 333/21 A; 343/700 MS, 786; 455/80, 81

[56] References Cited

U.S. PATENT DOCUMENTS

| | | | |
|---|---|---|---|
| 4,473,828 | 9/1984 | Mörz et al. | 455/81 X |
| 5,214,394 | 5/1993 | Wong | 330/286 |
| 5,329,248 | 7/1994 | Izadian | 330/295 X |

OTHER PUBLICATIONS

"A Grid Amplifier" IEEE Microwave and Guided Wave Letters, vol. 1, No. 11, Nov. 1991, Moonil Kim, et al., pp. 322–324.

"Bi-Directional Spatial Power Combiner for Millimeter--Wave Solid State Amplifiers" Sam H. Wong, et al.

*Primary Examiner*—Steven Mottola
*Attorney, Agent, or Firm*—George A. Montanye; Charles T. Silberberg; Tom Streeter

[57] ABSTRACT

A spatial power combiner includes a circularly corrugated horn 26, a meniscus lens 28, an amplifier array 16, and a layer of microwave absorbing material 34 on a housing interior 32. The lens 28 receives polarized microwave radiation from the horn 26 and collimates it, renders it in phase and with nearly uniformly amplitude, and distributes it across the lens aperture. The amplifier array 16 amplifies the radiation and re-radiates it, orthogonally polarized, to the lens 28, which focuses it back down the horn 26. An array of parasitic micropatches 24 between the lens 28 and amplifier array 16 provides impedance matching. A quarter-wave anti-reflecting coating 30 covers both surfaces of the lens 28. The microwave absorbing material 34 reduces or prevents resonance of higher order modes.

4 Claims, 3 Drawing Sheets

SPACE-FED HORN FOR QUASI-OPTICAL SPATIAL POWER COMBINERS

GOVERNMENT RIGHTS

This invention was made with Government support under National Aeronautics and Space Administration Contract NASW-4513. The Government has certain rights in this invention.

RELATED APPLICATION

This invention is related to the invention disclosed in the pending application of co-inventor Wong, Ser. No. 08/305,245, filed concurrently herewith on Sep. 13, 1994, and which is now U.S. Pat. No. 5,481,223, entitled "Bi=Directional Spatial Power Combiner Grid Amplifier," the disclosure of which is incorporated herein by reference.

BACKGROUND

This invention relates to extremely high frequency (EHF) and millimeter wave (MMN) amplifiers, and has particular relationship to amplifiers using quasi-optical spatial power combining techniques.

Attention is directed to Wong et al. (including several co-inventors of the present invention), "Bi-Directional Spatial Power Combiner for Millimeter-Wave Solid State Amplifiers" , Work Shop on Millimeter Nave Power Generation and Beam Control, Sep. 14, 1993, the disclosure of which is incorporated by reference. Attention is also directed to U.S. Pat. No. , 5,214,394, "High Efficiency Bi-Directional Spatial Power Combiner Amplifier" , issued May 25, 1993, to Sam H. Wong (a co-inventor of the present invention), the disclosure of which is also incorporated by reference.

As shown in FIG. 1 of the present application (which closely parallels FIG. 17 of the '394 patent), vertically polarized incident radiation 10 (especially in the gigahertz range) propagates through a collimating lens 12 to the broad end of a feedhorn 14. The lens 12 directs the incident radiation 10, which has been fed into the narrow end of the feedhorn 14, onto an amplifier array 16. The amplifier array 16 amplifies the incident radiation 10 and re-radiates it, as return radiation 18, back towards the narrow end of the feedhorn 14. The arrows symbolizing return radiation 18 are drawn longer than those symbolizing incident radiation 10 to indicate that return radiation 18 has more power.

The amplifier array 16 is constructed so that return radiation 18 is polarized orthogonally to that of incident radiation 10. An orthomode transducer 20 directs the return radiation 18 to the orthogonal port of the orthomode transducer 20 from the narrow end of the feedhorn 14. A circulator 22, situated on one side of the orthomode transducer 20 opposite the feedhorn 14, prevents feedback of return radiation 18 (and, indeed, leaking incident radiation 10) into the source of the incident radiation 10. An array of parasitic micropatches 24, situated between lens 12 and the amplifier array 16, provides impedance matching.

The '394 device works well, but has narrow bandwidth, because the enclosed horn with conductive walls supports higher order mode resonances.

SUMMARY OF THE INVENTION

The present invention overcomes these limitations by use of a circularly corrugated horn, a meniscus lens, and a layer of microwave absorbing material on the housing interior.

DETAILED DESCRIPTION OF THE DRAWINGS

Figure 1:
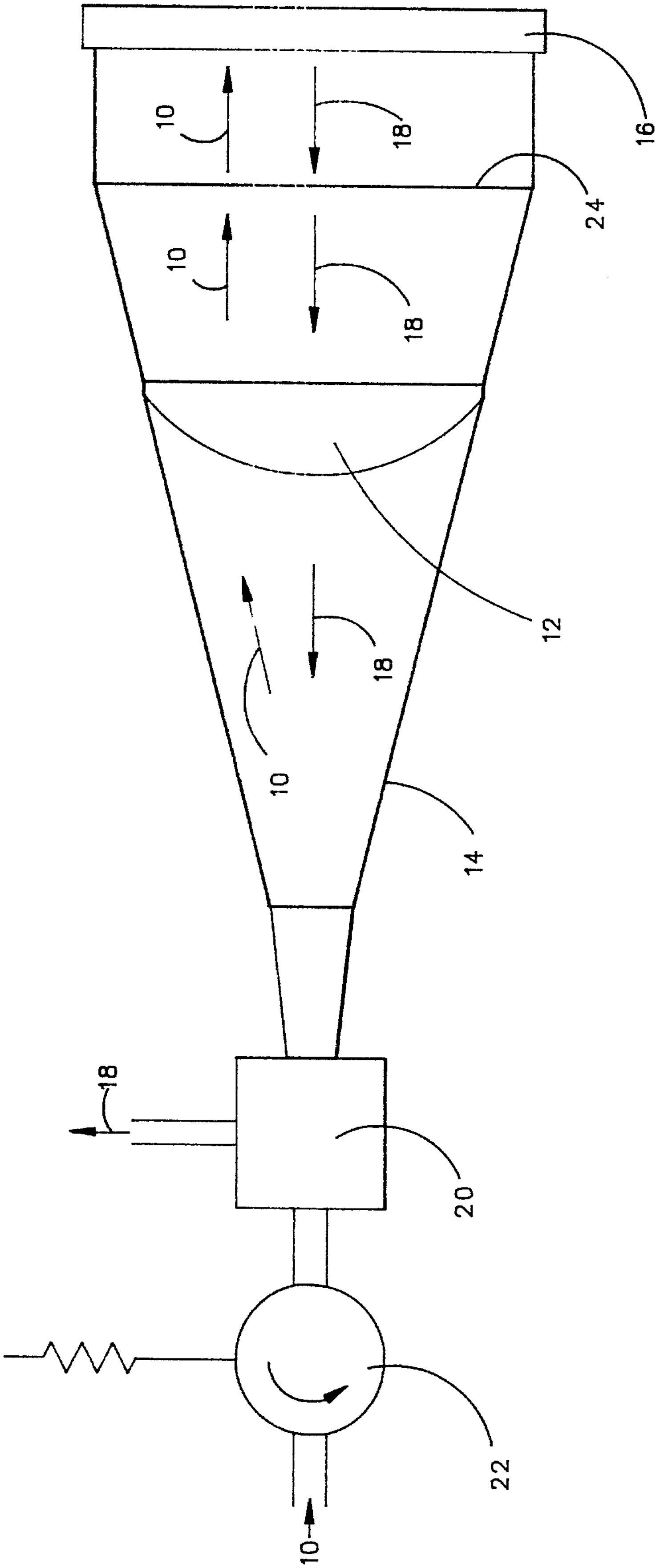
FIG. 1 PRIOR ART
FIG. 1 is a cross section of the '394 device.

FIG. 1 has been described in the background of the invention and will not be further discussed.

Circularly Corrugated Feedhorn

Figure 2:
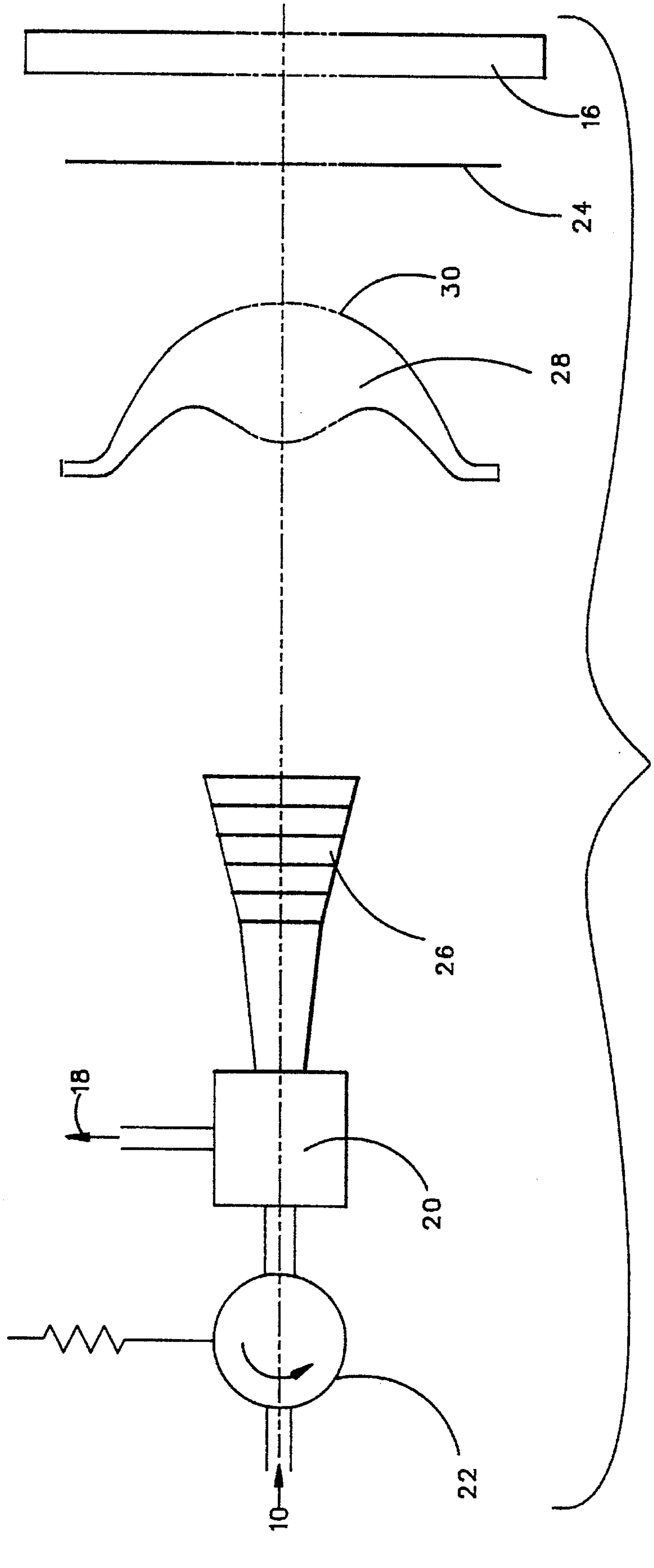
FIG. 2 is a cross section of a conceptualized version of the present invention.

In FIG. 2, the circulator 22 and orthomode transducer 20 of FIG. 1 drive the narrow end of a circularly corrugated horn 26. Such horns are old in the art and provide the radiation pattern characteristics that are necessary to achieve high efficiency for the amplifier. It is capable of radiating circularly symmetrical patterns with low side lobe levels.

Meniscus Lens

The horn 26 illuminates a meniscus lens 28. Such lenses are old in the art. The lens shape, including inner and outer surfaces, is designed to correct a spherical wave to an in-phase, near-uniform amplitude, field across the exit aperture of the lens.

The lens 28 can be constructed, as is known in the art, to include a quarter-wavelength dielectric coating 30 on both of its surfaces to provide the proper impedance matching.

As in the FIG. 1 device, the FIG. 2 device includes an array of parasitic micropatches 24, situated between lens 28 and grid amplifier 16, to provide impedance matching.

Microwave Absorbing Walls

A space-fed horn configuration of FIG. 2 has an advantage over the more conventional horn 14 of FIG. 1: a conventional large horn—any large horn with conductive walls or corrugated walls—supports higher order modes. When these horns are used in spatial power combiners, any asymmetric or perturbed amplitude or phase distribution will excite higher order modes. These higher order modes create resonances that affect the operation of the power amplifier in terms of oscillations, higher voltage-standing-wave-ratios, and reduced gain. The space-fed horn configuration of FIG. 2, with the corrugated horn 26, radiates to space, in an environment without conductive walls. Therefore, the space-fed horn configuration of FIG. 2 cannot support higher order modes.

Figure 3:
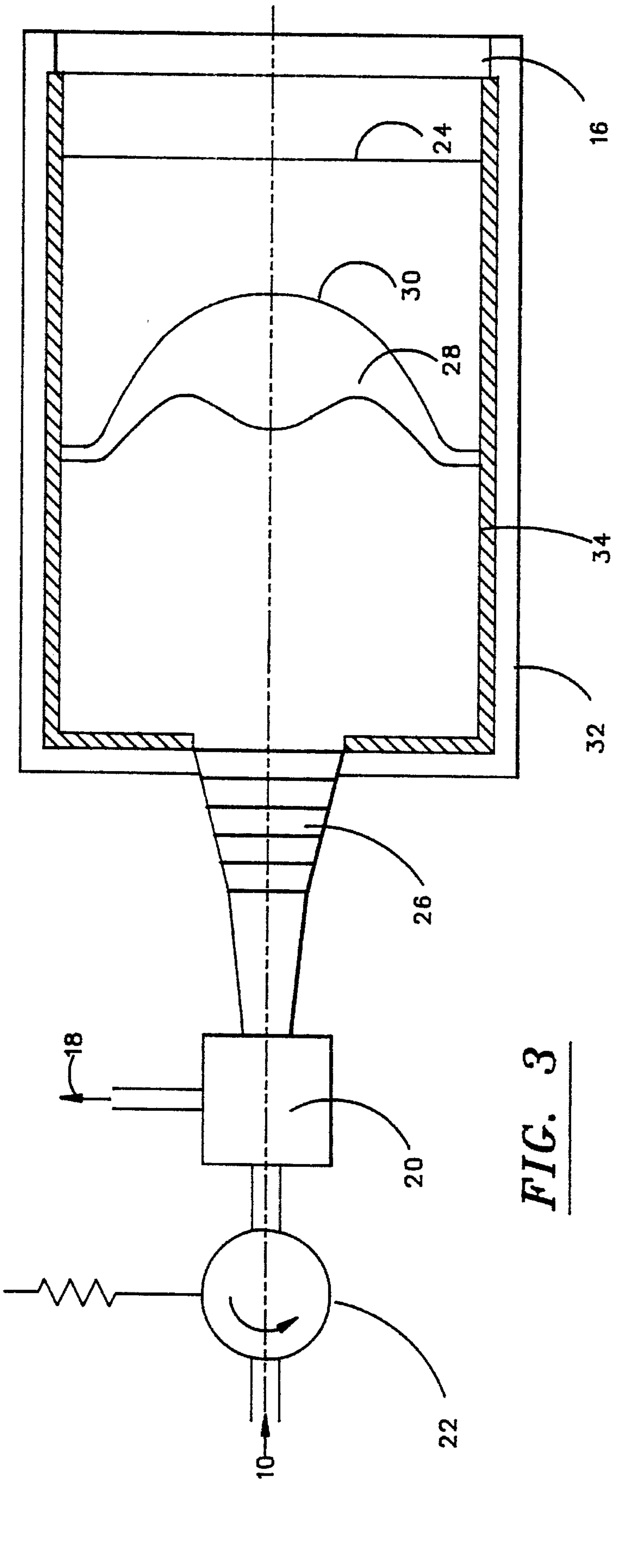
FIG. 3 is a cross section of a practical version of the present invention.

FIG. 3 shows a means to emulate the space-fed horn configuration of FIG. 2 in an enclosed structure. A housing 32 is mounted on the horn 26, and supports the lens 28, parasitic array 24, and amplifier 16. However, a layer 34 of microwave absorbing material is applied to the interior of the housing 32, thereby eliminating the higher order modes as effectively as an open structure in free space. Alternatively, the housing 32 could be made of microwave absorbing material, but this is not preferred, since such materials generally lack the requisite strength.

SCOPE OF INVENTION

While a particular embodiment of the present invention has been described in some detail, the true spirit and scope of the present invention are not limited thereto, but are limited only by the appended claims.

What is claimed is:

1. A spatial power combiner amplifier comprising:

(a) a circularly corrugated feedhorn;

(b) a meniscus lens situated to receive radiation emerging from the feedhorn and to emit collimated, in phase radiation of essentially uniform power density;

(c) an amplifier array situated to receive incident radiation emitted from the lens with a first polarization and to radiate return radiation to the lens with a second polarization which is orthogonal to the first polarization; and (d) a housing supporting and enclosing the feedhorn, the lens, and the amplifier array, the housing having an interior surface which is absorptive to microwave radiation.

2. The amplifier of claim 1, further comprising an array of parasitic micropatches situated between the lens and the amplifier array.

3. The amplifier of claim 1, wherein the interior surface of the housing includes a layer of microwave absorbing material.

4. The amplifier of claim 2, wherein the interior surface of the housing includes a layer of microwave absorbing material.

* * * * *